United States Patent
Shao et al.

(10) Patent No.: US 11,304,341 B2
(45) Date of Patent: Apr. 12, 2022

(54) LIQUID COOLING SYSTEM FOR IT RACKS

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/904,038

(22) Filed: Jun. 17, 2020

(65) Prior Publication Data
US 2021/0400840 A1    Dec. 23, 2021

(51) Int. Cl.
*H05K 7/20* (2006.01)

(52) U.S. Cl.
CPC ....... *H05K 7/2079* (2013.01); *H05K 7/20781* (2013.01)

(58) Field of Classification Search
CPC .......................... H05K 7/2079; H05K 7/20272
See application file for complete search history.

(56) References Cited

U.S. PATENT DOCUMENTS

| 2016/0066480 A1* | 3/2016 | Eckberg | F16L 37/30 361/679.53 |
|---|---|---|---|
| 2018/0063992 A1* | 3/2018 | Wan | H05K 7/20254 |
| 2020/0106297 A1* | 4/2020 | Ross | H05K 7/2079 |

* cited by examiner

*Primary Examiner* — Mukundbhai G Patel
(74) *Attorney, Agent, or Firm* — Womble Bond Dickinson (US) LLP

(57) ABSTRACT

Embodiments are disclosed of an apparatus including a room manifold comprising at least one fluid loop. A plurality of rack manifolds is fluidly coupled to, and projects from, the room manifold. Each rack manifold includes one or more connectors to couple the rack manifold to one or more components within an electronics rack. A plurality of valves is fluidly coupled in the room manifold, and each rack manifold is fluidly coupled to the room manifold between a pair of valves. The pair of valves can be used to terminate flow between the room manifold and each rack manifold.

20 Claims, 4 Drawing Sheets

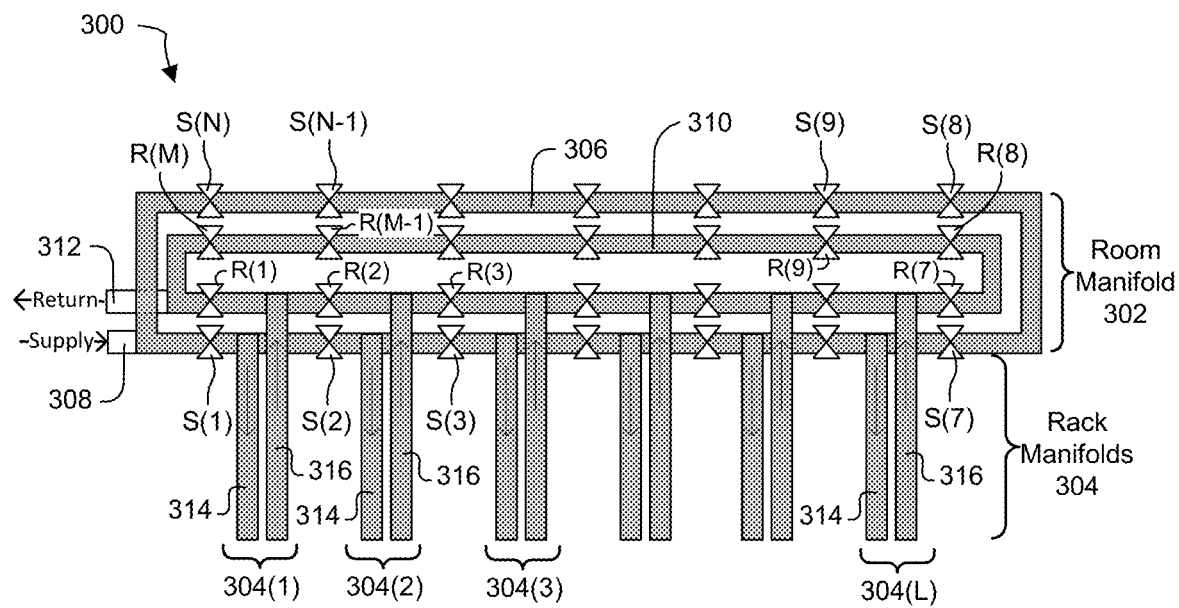
*Fig. 3A*
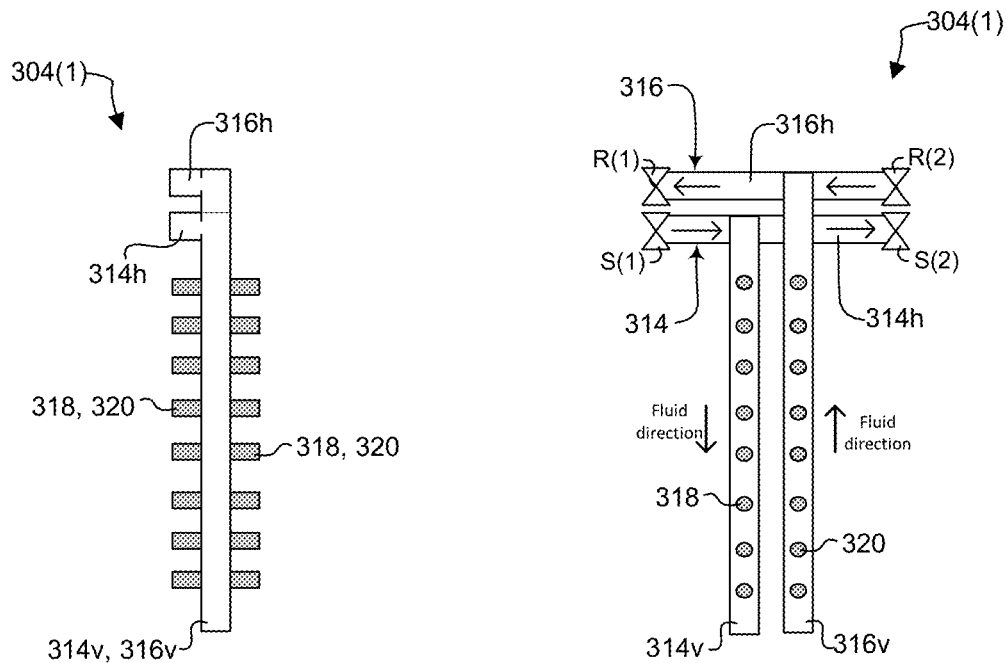
*Fig. 3B*     *Fig. 3C*

LIQUID COOLING SYSTEM FOR IT RACKS

TECHNICAL FIELD

The disclosed embodiments relate generally to liquid cooling systems for temperature control of electronic equipment and in particular, but not exclusively, to a liquid cooling manifold system for temperature control in data center equipment.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Much modern IT equipment therefore requires liquid cooling.

As a result of the requirement for liquid cooling, some pieces of IT equipment have an on-board cooling system that is thermally coupled to individual components that need cooling. But these on-board cooling systems usually do not operate in isolation. They are usually coupled to at least one larger cooling system, such as liquid cooling system in an electronics rack. The rack's cooling system can in turn be coupled to the liquid cooling system of a larger facility such as a data center. In such a system, the data center's cooling system circulates a working fluid through the rack cooling system, which in turn circulates the working fluid through the cooling system on the piece of IT equipment.

This type of multi-level cooling system requires many fluid connections, but the many connections also provide many opportunities for fluid leaks that can be harmful or fatal to the electronic components. Moreover, in some applications the connections can be in locations that are very difficult to reach, making manual connection more difficult and further increasing the opportunities for leaks.

Reliability is one of the challenges for deploying liquid cooling solutions at scale. Connectors are key components in a liquid cooling systems, and they substantially affect reliability because they have high failure rates. Properly designing and implementing manifolds on room level and rack level in liquid cooling system is important. Blind mating dripless quick disconnects are gradually being adopted by server and data center thermal system designers because they bring a lot of benefits to the system, such as ease of server installation, no requirement of manual operation for fluid connectors, and so on. But the connectors between room manifolds and rack manifolds are typically large sizes and have relatively high risk of fluid leakage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 3A-3C are views of an embodiment of a liquid cooling manifold arrangement. FIG. 3A is a schematic of an embodiment of the overall system, while FIGS. 3B-3C are side and front views, respectively, of an embodiment of a rack manifold.

DETAILED DESCRIPTION

Embodiments are described of a liquid cooling system for IT racks. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments are of a liquid cooling (LC) manifold for room-level and rack-level liquid cooling. The purpose of an LC manifold is to distribute working fluid from a facility fluid supply into different server chassis in racks. In this application, the LC manifold's rack manifold part is not necessarily assembled together with rack, but assembled as part of a facility equipment of liquid cooling solution.

The disclosed embodiment of an LC manifold include a room manifold part and a rack manifold part that are integrally connected. This design improves the reliability by eliminating connector failure. Also it is designed as multiple sectional modules and to be assembled in a working environment, which reduces or eliminates problems with shipping and handling. The rack manifold part has fluid connectors on two sides, can support liquid cooling modules from two racks at the same time, or can support two different cooling modules for each server chassis in one rack. The fluid connectors can provide blind-mating connection between rack manifold and the cooling module in server chassis on one side. A ring-structure provides redundancy: one or multiple rack manifolds can be bypassed without impacting the other rack manifolds. This liquid cooling architecture design integrates rack manifold and room manifold to improve the reliability by reducing the risk of connector failure.

Figure 1:
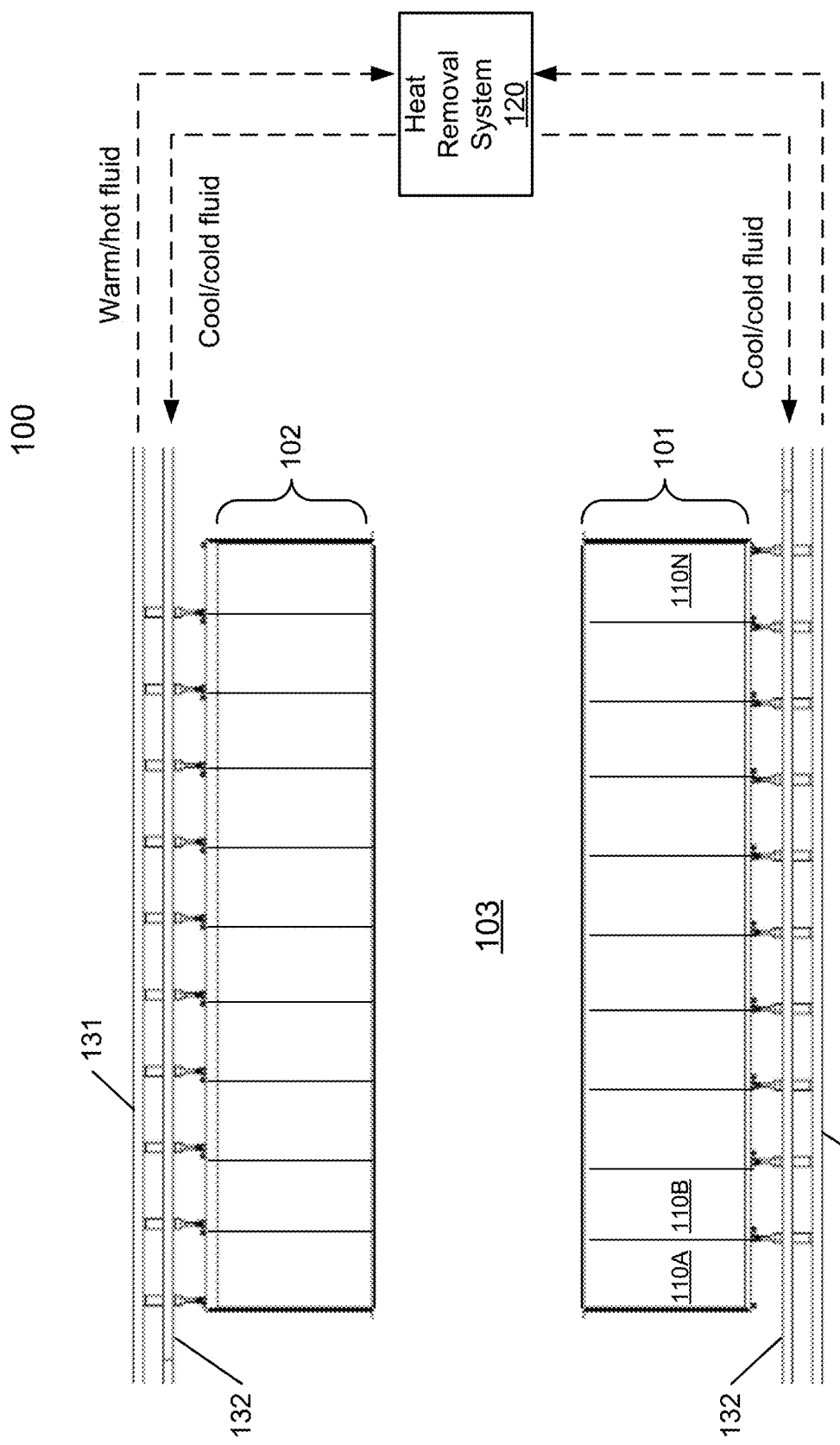
FIG. 1 is a block diagram of an embodiment of a data center.

FIG. 1 is a block diagram illustrating an embodiment of a data center system FIG. 1 shows a top view of at least a part of a data center system 100. Data center system 100 includes rows of electronic racks of IT components, equipment or instruments 101-102, such as, for example, computer servers that provide data services to a variety of clients. In this embodiment data center system 100 includes electronic racks, such as electronic racks 110A-110N, arranged in row 101 and row 102, but in other embodiments can have more or fewer rows than shown. Typically, rows 101-102 are aligned in parallel with front ends facing each other and back ends facing away from each other, forming aisle 103 in between to allow an administrative person walking therein. However, other configurations or arrangements can also be applied.

In one embodiment, each electronic rack (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a back end of the electronic rack. The back panel includes a working fluid manifold assembly to provide working fluid from an external heat removal system 120 to remove heat from the server blades. Each server blade can be inserted and removed from a corresponding server slot from a front end of the electronic rack. Heat removal system 120 can be a chiller system with an active refrigeration cycle. Alternatively, heat removal system 120 can include but not limited to evaporative cooling, free air, rejection to large thermal mass, and waste heat recovery designs.

In one embodiment, each electronic rack in rows 101-102 includes a working fluid manifold, a number of server blades contained in a number of server blade slots, and a coolant distribution unit (CDU). The working fluid manifold provides working fluid to each of the server blades. Each sever blade receives working fluid from the working fluid manifold, to remove at least a portion of the heat generated by an IT component of the server blade using the working fluid manifold, and to transmit warmer liquid carrying the heat exchanged from the IT component back to the working fluid manifold. The CDU is configured to receive data representing a workload of the IT components of the server blades and to control a liquid flow rate of the working fluid supplied to the working fluid manifold based on the workload of the IT components of the server blades.

The working fluid manifold disposed on the back end of each electronic rack is coupled to liquid supply line 132 to receive working fluid from heat removal system 120. The working fluid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply working fluid to all of the electronic racks of rows 101-102.

Figure 2:
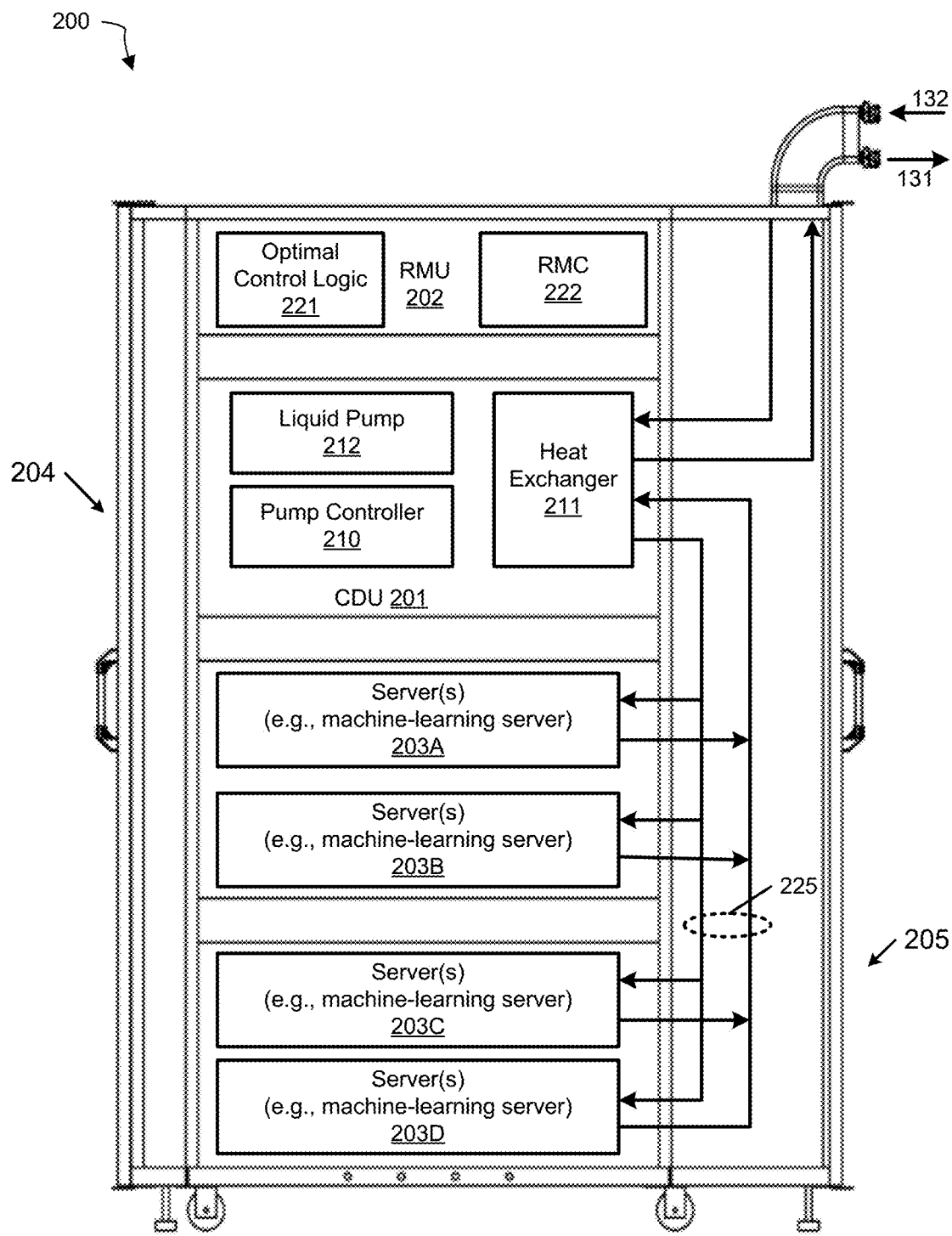
FIG. 2 is a block diagram of an embodiment of an electronic rack.

FIG. 2 is a block diagram illustrating a side view of an embodiment of an electronic rack. Electronic rack 200 can represent any of the electronic racks of rows 101-102 of FIG. 1, such as electronic racks 110A-110N. In one embodiment, electronic rack 200 includes CDU 201, rack management unit (RMU) 202, and one or more server blades 203A-203D, collectively referred to as server blades 203. Sever blades 203 can be inserted into an array of server slots respectively from front end 204 of electronic rack 200. Note that although only four server blades 203A-203D are shown, more or fewer server blades can be maintained within electronic rack 200. Also note that the particular positions of CDU 201, CMU 202, and server blades 203 are shown for the purpose of illustration only; other arrangements or configurations of CDU 201, CMU 202, and server blades 203 can also be implemented. Further, the front door disposed on front end 204 and the back door disposed on back end 205 are optional. In some embodiments, there can no door on front end 204 and/or back end 205.

In one embodiment, CDU 201 includes heat exchanger 211, liquid pump 212, and pump controller 210. Heat exchanger 211 can be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 can be disposed or mounted on back end 205 of electronic rack 200. In addition, heat exchanger 211 further includes a second tube having a second pair of liquid connectors coupled to liquid manifold 225, which can include a supply manifold to supply cooling liquid to server blades 203 and a return manifold to return warmer liquid back to CDU 201. The processors can be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each server blade 203 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 203 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 200 further includes RMU 202 configured to provide and manage power supplied to server blades 203 and CDU 201. RMU 202 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

FIGS. 3A-3B illustrate an embodiment of a manifold system 300 usable in a liquid cooling system such as the ones shown in FIGS. 1-2 and described above. Manifold system 300 includes two main parts: room manifold 302 and one or more rack manifolds 304 fluidly coupled to the room manifold. The term "fluidly coupled," when applied herein to a pair of elements, means that the elements are coupled to each other, directly or indirectly, in such a way that a fluid can flow in them or between them in one or both directions.

Room manifold 302 includes a supply loop 306 having a supply inlet 308 and a return loop 310 having a return outlet. Supply inlet 308 can be fluidly coupled to a source of cool working fluid, and return outlet 312 can be fluidly coupled to a destination for hot working fluid so that, as their names imply, supply loop 306 supplies cool working fluid to a room in which room manifold 302 is positioned, while return loop 310 is used to return hot working fluid. In one embodiment, supply inlet 308 and return outlet 312 can be fluidly coupled to a heat removal system associated with a data center (see, e.g., FIG. 1). In the illustrated embodiment supply loop 306 and return loop 310 are quadrilateral, but in other embodiments the can have other shapes, such as round, elliptical, triangular, etc.

Supply loop 306 and return loop 310 each have a plurality of valves positioned along at least part of their lengths. Supply loop 306 has N valves S(1)-S(N) fluidly coupled in it, where N can be any integer 1 or greater, while return loop 310 has M valves R(1)-R(M) fluidly coupled in it, where M can be any integer one or greater. In the illustrated embodiment the supply and return loops have the same number of valves (N=M), but in other embodiment the loops need not have the same number of valves (N≠M). In the illustrated embodiment N=M=14, but other embodiments can include more or less valves than shown.

Rack manifolds 304(1)-304(L) are fluidly coupled to at least part of room manifold 302, where L can be any integer one or greater. In the illustrated embodiment L=6, so that there are six rack manifolds 304(1)-304(6), but in other embodiments L can be greater than or less than 6, so that there can be more or less rack manifolds than shown. In the illustrated embodiment the room manifold is quadrilateral and rack manifolds are fluidly coupled along only one segment or side of the quadrilateral (e.g., between valves S(1)-S(7) and between valves R(1)-R(7)), but in other embodiments rack manifolds can be coupled into other parts or segments of the room manifold (e.g., between valves S(8)-S(N) and between valves R(8)-R(N)).

In the illustrated embodiment each rack manifold 304 includes a rack supply manifold 314 fluidly coupled to supply loop 306 and a rack return manifold 316 fluidly coupled to return loop 310. In each rack manifold 304, rack supply manifold 314 is fluidly coupled to supply loop 306 between a pair of valves: in rack manifold 304(1), rack supply manifold 314 is fluidly coupled between valves S(1) and S(2); in rack manifold 304(2), rack supply manifold 314 is fluidly coupled between valves S(2) and S(3); and so on. Similarly, in each rack manifold 304, rack return manifold 316 is fluidly coupled to return loop 310 between a pair of valves: in rack manifold 304(1), rack return manifold 316 is fluidly coupled between valves R(1) and R(2); in rack manifold 304(2), rack return manifold 316 is fluidly coupled between valves R(2) and R(3); and so on.

This ring or loop structure of manifold arrangement 300 provides redundancy for liquid cooling. For instance, if a failure occurs in a server coupled to rack manifold 304(1) and that rack manifold must be bypassed—e.g., if the fluid supply needs to be shut down for one server, or leakage occurs on connectors—supply valves S(1)-S(2) and/or return valves R(1)-R(2) can be shut down, thus stopping the flow of fluid into and/or out of rack manifold 304(1). The remaining supply valves S and return valves R can remain open so that the manifold arrangement can continue supplying working fluid to, and returning working fluid from, other racks.

FIGS. 3B-3C together illustrate an embodiment of a rack manifold 304. FIG. 3B is a front view, FIG. 3C a side view. The discussion below refers specifically to rack manifold 304(1), but can apply analogously to any of rack manifolds 304(1)-304(L). As discussed above, each rack manifold 304 includes a rack supply manifold 314 and a rack return manifold 316. In the illustrated embodiment, rack supply manifold 314 is substantially T-shaped and includes a horizontal first part 314h and a vertical second part 314v. Similarly, rack return manifold 316 is substantially T-shaped and includes a horizontal first part 316h and a vertical second part 316v. The T-shape structures can be designed as a single section in one embodiment. Note that the terms "horizontal" and "vertical" refer to the orientation shown in the drawing, but do not limit the orientation of these components in actual use. The horizontal and vertical parts of each manifold can be formed as an integrated section to reduce the probability of leakage.

The horizontal section of each manifold is fluidly coupled to a pair of valves: horizontal section 314h of the rack supply manifold is fluidly coupled to valves S(1) and S(2), while horizontal section 316h of the rack return manifold is fluidly coupled to valves R(1) and R(2). In this embodiment of the rack manifold 304, then, the horizontal parts 314h and 316h are joined together by valves to form at least part of the room manifold 302. Put differently, horizontal parts 314h are joined together by valves to form a part of supply loop 308, and horizontal parts 316h are joined together by valves to form a part of return loop 310. Room manifold 302 part is typically very long, which can create difficulty with shipping and handling. A flange joint could be used additional to the valves to enhance the integrity of the connection.

The vertical section of each rack manifold is integrally formed with, and projects from its corresponding horizontal section. In the illustrated embodiment, vertical part 314v projects vertically downward from horizontal part 314h and vertical part 316v projects vertically downward from horizontal part 316h. In the illustrated embodiment the vertical part of each manifold is substantially perpendicular to the horizontal part of the manifold, but in other embodiments it need not be perpendicular and can instead be at an angle different than shown.

Each vertical section includes multiple connectors by which the manifold can be fluidly coupled to electronic equipment in racks. Vertical part 314v of supply manifold 314 includes a plurality of supply connectors 318 and vertical part 316v of return manifold 314 includes a plurality of return connectors 320. In both vertical parts 314v and 316v, connectors are positioned on two sides of the manifold (see FIG. 3B); in the illustrated embodiment the connectors are on opposite sides of the manifold, but in other embodiments they need not be on opposite sides. By putting connectors 318 and 320 on multiple sides of their respective manifolds, each manifold can support two types of cooling solutions at the same time. For example, a connector on one side can be coupled to a cold plate liquid cooling module in a server chassis, while the connector on the other side can be coupled with a connector on a rear-door heat exchanger, or coupled with a connector on an in-row cooler. For the latter scenario, regular flexible hoses can be used. In normal operation, each rack manifold part receives the fluid on its top side. When an arbitrary liquid cooled IT rack has failure (e.g., fluid leakage, or T equipment failure that needs shut down fluid supply), this rack manifold can be bypassed by closing the two valves near it. In the meantime, the fluid supply and return of other rack manifolds are not affected.

Figure 4:
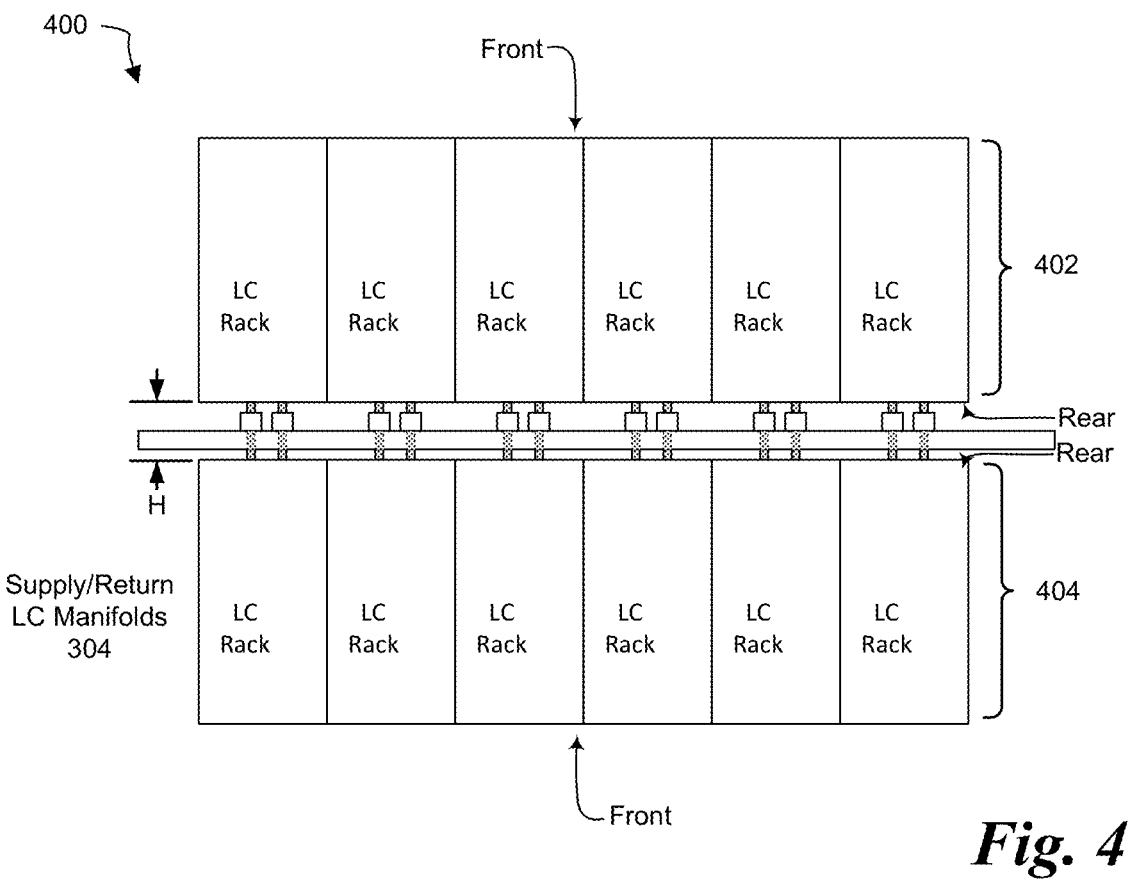
FIG. 4 is a plan view of an embodiment rack arrangement in a data center.

FIG. 4 illustrates an embodiment of a rack arrangement 400. In many current data centers, the electronics racks are arranged to provide hot aisles and cold aisles. In the hot aisle/cold aisle arrangement, sets of two rows of racks are positioned back-to-back and spaced apart with a large aisle between them. Multiple sets are then placed in the data center, such that the aisles between sets are cold aisles and the aisles between racks in a set are hot aisles. In rack arrangement 400, liquid-cooled (LC) electronics racks are grouped into two rows 402 and 404 that are positioned back-to-back—that is, the rear part of each rack in row 402 faces the rear part of each rack in row 404. Rows 402 and 404 are spaced apart by distance H, which is much smaller than a normal hot aisle. In one embodiment, H need only be wide enough to accommodate manifold racks such as the ones described above. Among other things, the smaller distance H allows more racks to be housed in a data center.

A set of manifold racks 304 (see FIGS. 3A-3C) is positioned in the gap between row 402 and row 404. In each manifold rack, the connectors on one side of vertical parts 314v and 316v of the manifold are fluidly coupled to components within the racks in row 402, while connectors on the other side of vertical parts 314v and 316v are fluidly coupled to components within the racks in row 404. The connectors should be facing right into the rear side of the server chassis, which is to compatible with blind-mate interface on the server chassis. The blind mate connectors indicate that the operator is only required to push the server chassis into mounting rail in the IT rack and the connection is engaged. There are latches on the front panel of the server chassis to secure how much depth the server is pushed in, preventing the blind-mating connection is disengaged by itself.

For IT racks are entirely cooled by cold plate liquid cooling, then, two back-to-back racks can share one set of manifolds: one supply and one return. Servers in both rows of racks can have blind-mating connections with the LC manifold. Connectors on the second side of each manifold might need to be designed longer to reach their corresponding row of racks.

Figure 5:
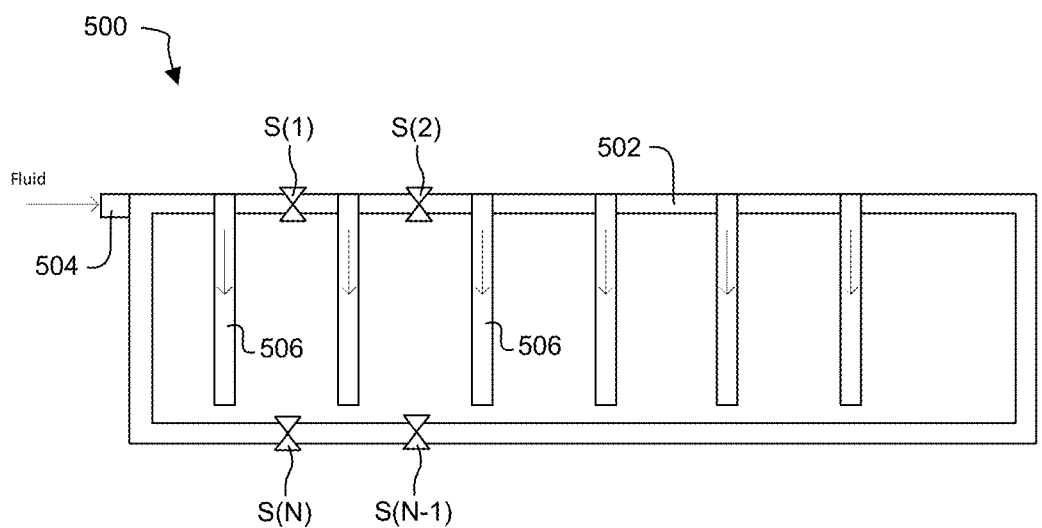
FIG. 5 is a schematic view of another embodiment of a liquid cooling manifold arrangement.

FIG. 5 illustrates another embodiment of a manifold arrangement 500. Manifold arrangement 500 is similar in many ways to manifold arrangement 300. Manifold arrangement includes a supply loop 502 with an inlet 504. A plurality of valves S(1)-S(N) are positioned in the supply loop and, as in manifold arrangement 300, one or more rack manifolds 506 are positioned between a pair of valves S. Rack manifolds 506 can have a construction similar to rack manifolds 304, as described above. Manifold arrangement 500 differs from arrangement 300 primarily in that it is a single loop, thereby saving space in space-constrained applications. Instead, the working fluid remains circulating through the loop, augmented by cool working fluid received through inlet 504. As in arrangement 300, valves S can be used to stop flow to certain rack manifolds 506 when needed. This embodiment of a manifold arrangement 500 applies to both supply and return manifolds.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
   a room manifold comprising at least one fluid loop;
   a plurality of rack manifolds fluidly coupled to, and projecting from, the room manifold, each rack manifold including one or more connectors to couple the rack manifold to one or more components within an electronics rack; and
   a plurality of valves fluidly coupled in the room manifold, each rack manifold including a horizontal first part and a vertical second part, the vertical second part projecting from the horizontal first part and integrally formed with the horizontal first part, and the horizontal first part of each rack manifold being fluidly coupled into the room manifold between a corresponding pair of valves, wherein the corresponding pair of valves can be used to terminate flow between the room manifold and each rack manifold.

2. The apparatus of claim 1 wherein the room manifold comprises:
   a supply loop having the plurality of valves fluidly coupled therein; and
   a return loop having the plurality of valves fluidly coupled therein, the return loop being separate from the supply loop.

3. The apparatus of claim 2 wherein each rack manifold comprises:
   a rack supply manifold fluidly coupled to the supply loop, positioned between the corresponding pair of valves in the supply loop, and having one or more supply connectors; and
   a rack return manifold fluidly coupled to the return loop, positioned between the corresponding pair of valves in the return loop, and having one or more return connectors.

4. The apparatus of claim 3 wherein:
   the horizontal first part of each rack supply manifold is coupled between the corresponding pair of valves so that it forms part of the supply loop; and
   the horizontal first part of each rack return manifold is coupled between the corresponding pair of valves so that it forms part of the return loop.

5. The apparatus of claim 3 wherein the rack supply manifold has supply connectors on multiple sides and the rack return manifold has return connectors on multiple sides.

6. The apparatus of claim 1 wherein the room manifold is horizontally positioned and the plurality of rack manifolds are vertically positioned adjacent to at least one row of electronics racks.

7. The apparatus of claim 1 wherein each rack manifold has connectors on two sides.

8. The apparatus of claim 1 wherein the plurality of rack manifolds project only from a part of the room manifold.

9. The apparatus of claim 8 wherein the plurality of valves includes valves positioned in parts of the room manifold from which rack manifolds do not project.

10. A data center comprising:
    a plurality of electronics racks arranged in at least one row;
    a heat exchanger;
    a room manifold comprising at least one fluid loop coupled to the heat exchanger;
    a plurality of rack manifolds fluidly coupled to, and projecting from, the room manifold, each rack manifold including one or more connectors to couple the rack manifold to one or more components within at least one of the plurality of electronics racks; and
    a plurality of valves fluidly coupled in the room manifold, each rack manifold including a horizontal first part and a vertical second part, the vertical second part projecting from the horizontal first part and integrally formed with the horizontal first part, and the horizontal first part of each rack manifold being fluidly coupled into the room manifold between a corresponding pair of valves, wherein the corresponding pair of valves can be used to terminate flow between the room manifold and each rack manifold.

11. The data center of claim 10 wherein the room manifold is horizontal and is positioned above or below the plurality of electronics racks.

12. The data center of claim 10 wherein the plurality of electronics racks is arranged back to back in groups of two rows and wherein the plurality of rack manifolds for each group are positioned in between the two rows.

13. The data center of claim 10 wherein the room manifold comprises:
a supply loop having the plurality of valves fluidly coupled therein; and
a return loop having the plurality of valves fluidly coupled therein, the return loop being separate from the supply loop.

14. The data center of claim 13 wherein each rack manifold comprises:
a rack supply manifold fluidly coupled to the supply loop, positioned between the corresponding pair of valves in the supply loop, and having one or more supply connectors; and
a rack return manifold fluidly coupled to the return loop, positioned between the corresponding pair of valves in the return loop, and having one or more return connectors.

15. The data center of claim 14 wherein:
the horizontal first part of each rack supply manifold is coupled between the corresponding pair of valves so that it forms part of the supply loop; and
the horizontal first part of each rack return manifold is coupled between the corresponding pair of valves so that it forms part of the return loop.

16. The data center of claim 14 wherein the rack supply manifold has supply connectors on both sides and the rack return manifold has return connectors on both sides.

17. The data center of claim 10 wherein the room manifold is horizontally positioned and the plurality of rack manifolds are vertically positioned adjacent to at least one row of racks.

18. The data center of claim 10 wherein each rack manifold has connectors on two sides.

19. The data center of claim 10 wherein the plurality of rack manifolds project only from a part of the room manifold.

20. The data center of claim 19 wherein the plurality of valves includes valves positioned in parts of the room manifold from which rack manifolds do not project.

* * * * *